United States Patent
Uemura et al.

(10) Patent No.: US 9,052,119 B2
(45) Date of Patent: Jun. 9, 2015

(54) VENTILATION MEMBER

(71) Applicant: Nitto Denko Corporation, Ibaraki-shi, Osaka (JP)

(72) Inventors: Kou Uemura, Osaka (JP); Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 14/226,185

(22) Filed: Mar. 26, 2014

(65) Prior Publication Data

US 2014/0290488 A1 Oct. 2, 2014

(30) Foreign Application Priority Data

Mar. 26, 2013 (JP) .................. 2013-064108

(51) Int. Cl.
| | |
|---|---|
| B01D 53/22 | (2006.01) |
| F24F 13/28 | (2006.01) |
| H05K 5/02 | (2006.01) |
| C01B 3/50 | (2006.01) |
| B01D 63/08 | (2006.01) |

(52) U.S. Cl.
CPC ............. *F24F 13/28* (2013.01); *C01B 3/503* (2013.01); *C01B 2203/047* (2013.01); *B01D 63/08* (2013.01); *B01D 53/228* (2013.01); *B01D 53/22* (2013.01); *H05K 5/0213* (2013.01)

(58) Field of Classification Search
CPC ....... F24F 13/28; H05K 5/0213; B01D 53/22; B01D 53/228; B01D 63/08; C01B 3/503; C01B 2203/047
USPC ...................................................... 55/385.4
See application file for complete search history.

(56) References Cited

U.S. PATENT DOCUMENTS

| | | | | |
|---|---|---|---|---|
| 2,783,856 | A * | 3/1957 | Krause | 96/403 |
| 4,853,013 | A * | 8/1989 | Rio et al. | 96/6 |
| 5,160,515 | A * | 11/1992 | Nelson et al. | 96/224 |
| 5,256,159 | A * | 10/1993 | Newman | 604/317 |
| 5,316,568 | A * | 5/1994 | Brown | 95/31 |
| 5,782,960 | A * | 7/1998 | Ogawa et al. | 96/11 |
| 6,015,444 | A * | 1/2000 | Craft et al. | 55/320 |
| 6,306,191 | B1 * | 10/2001 | McInerney et al. | 55/385.4 |
| 6,364,924 | B1 * | 4/2002 | Mashiko et al. | 55/385.4 |
| 6,497,747 | B1 * | 12/2002 | Ding et al. | 95/45 |

(Continued)

FOREIGN PATENT DOCUMENTS

JP 2007-141629 6/2007

*Primary Examiner* — Jason M Greene
*Assistant Examiner* — Anthony Shumate
(74) *Attorney, Agent, or Firm* — Hamre, Schumann, Mueller & Larson, P.C.

(57) ABSTRACT

The ventilation member of the present invention includes: a support; and an air-permeable membrane disposed on the support. The support includes: a base portion supporting the air-permeable membrane; and a leg portion extending from the base portion toward the interior space of a housing and adapted to fix the ventilation member to the opening of the housing. The leg portion includes: insertion portions separated from each other in a circumferential direction by slits formed between the insertion portions, the insertion portions being adapted to be elastically deformed radially inwardly when the insertion portions are inserted into the opening and then to be fixed to the opening; and rounded portions each formed in a region between an inner circumferential surface of the insertion portion and a circumferential end surface of the insertion portion at a root of the insertion portion and having a rounded convex surface.

4 Claims, 7 Drawing Sheets

(56) References Cited

U.S. PATENT DOCUMENTS

| | | | |
|---|---|---|---|
| 7,279,027 B2* | 10/2007 | Carolan et al. | 96/11 |
| 8,727,844 B2* | 5/2014 | Furuyama et al. | 454/284 |
| 8,828,125 B2* | 9/2014 | Furuuchi et al. | 96/4 |
| 2006/0160200 A1* | 7/2006 | Rathenow et al. | 435/177 |
| 2007/0246366 A1* | 10/2007 | Mordkovich et al. | 204/627 |
| 2009/0047890 A1* | 2/2009 | Yano et al. | 454/143 |
| 2011/0275305 A1* | 11/2011 | Egersdoerfer et al. | 454/339 |
| 2014/0290489 A1* | 10/2014 | Uemura et al. | 96/4 |
| 2014/0290490 A1* | 10/2014 | Uemura et al. | 96/4 |

* cited by examiner

VENTILATION MEMBER

BACKGROUND OF THE INVENTION

1. Field of the Invention

The present invention relates to a ventilation member to be attached to an opening of a housing.

2. Description of Related Art

Conventionally, in automotive electrical/electronic components such as automotive lamps and ECUs (electronic control units), OA (office automation) equipment, household electrical appliances, medical equipment, etc., openings are formed in housings containing electronic components, control boards, etc. to reduce pressure fluctuations in the housings or to ventilate the interior of the housings, and ventilation members are attached to the openings. These ventilation members not only ensure ventilation between the interior and exterior of the housings but also prevent foreign substances from entering the housings.

For example, as shown in FIG. 12, JP 2007-141629 A discloses a ventilation member 110 to be attached to an opening 121 of a housing 120. The ventilation member 110 includes a support 104, an air-permeable membrane 102 disposed on the support 104, a cover member 106 covering the air-permeable membrane 102, and a sealing member 108 mounted between the support 104 and the housing 120. The support 104 has a base portion 111 and a leg portion 112 extending from the base portion 111. The leg portion 112 has: insertion portions 131 separated from each other in a circumferential direction by slits 132 formed between the insertion portions 131 in an insertion start side of the leg portion 112 and adapted to be elastically deformed radially inwardly to be inserted into the opening 121; and a hook 134 formed on at least one of the insertion portions 131 and protruding radially outwardly. The hook 134 is engaged with the housing 120 to prevent detachment of the ventilation member 110 from the housing 120.

SUMMARY OF THE INVENTION

In such a conventional ventilation member, when the insertion portions are inserted into the opening while being elastically deformed radially inwardly and fixed to the opening, the inner circumferential surface of the insertion portion may crack. If the cracked ventilation member is left attached into the opening, the cracks may develop, fracture the root of the insertion portion, and make the ventilation member more likely to be detached from the housing.

In view of these circumstances, it is an object of the present invention to provide a ventilation member suitable for preventing cracks on the inner circumferential surface at the root of an insertion portion.

The present invention provides a ventilation member attachable to a housing having an interior space that requires ventilation and an opening for ventilation. This ventilation member includes: a support having a vent hole serving as a part of an air passage between the interior space and an exterior space of the housing; and an air-permeable membrane disposed on the support to cover one end of the vent hole that opens into the exterior space. The support includes: a base portion supporting the air-permeable membrane; and a leg portion extending from the base portion toward the interior space and adapted to fix the ventilation member to the opening of the housing. The leg portion includes: insertion portions separated from each other in a circumferential direction by slits formed between the insertion portions in an insertion start side of the leg portion, the insertion portions being adapted to be elastically deformed radially inwardly when the insertion portions are inserted into the opening and then to be fixed to the opening; and rounded portions each formed in a region between an inner circumferential surface of the insertion portion and a circumferential end surface of the insertion portion at a root of the insertion portion and having a rounded convex surface.

According to the present invention, since the rounded portion is provided in a region between the inner circumferential surface and the circumferential end surface at the root of the insertion portion, stress is less likely to concentrate on the inner circumferential surface at the root of the insertion portion. Therefore, it is possible to prevent formation of cracks on the inner circumferential surface at the root of the insertion portion.

DETAILED DESCRIPTION OF THE INVENTION

Hereinafter, embodiments of the present invention are described with reference to the accompanying drawings. The following description relates to examples of the present invention, and the present invention is not limited to these examples.

Figure 1:
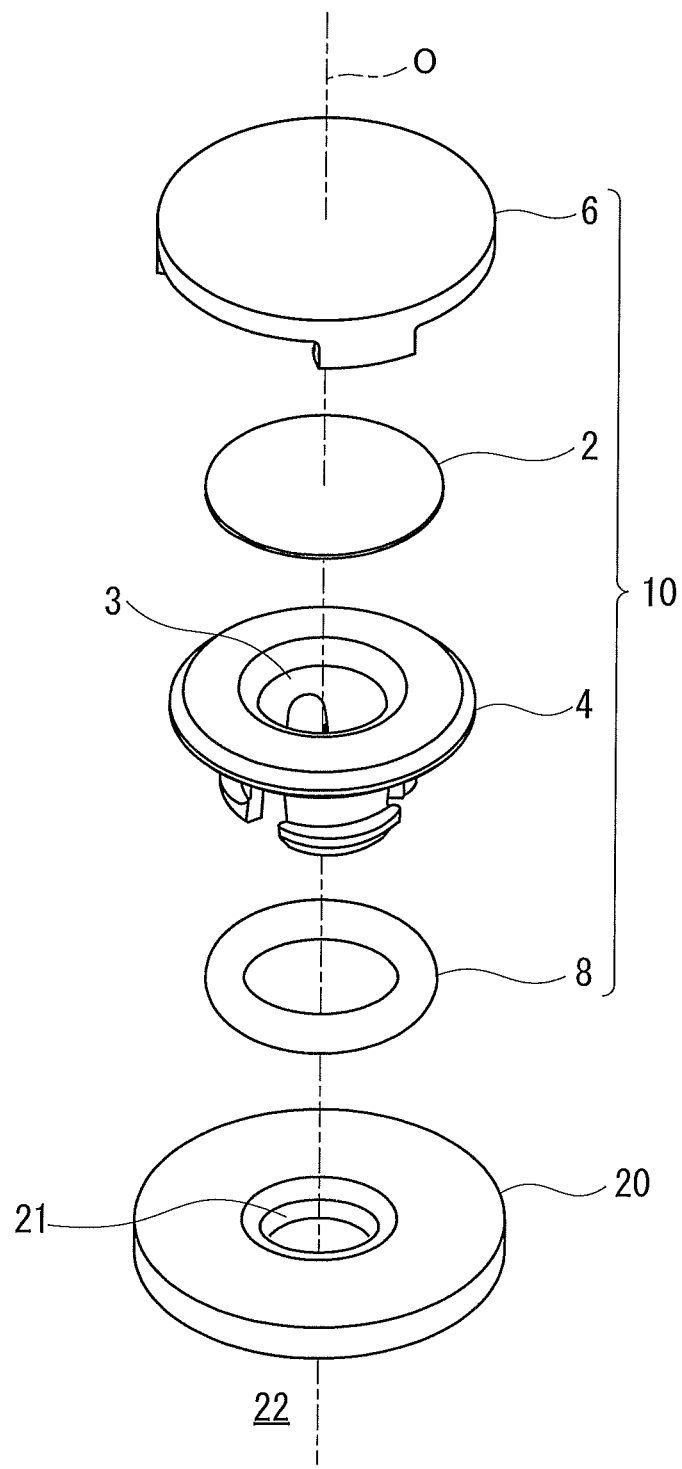
FIG. 1 is an exploded perspective view of a ventilation member according to an embodiment of the present invention.
Figure 2:
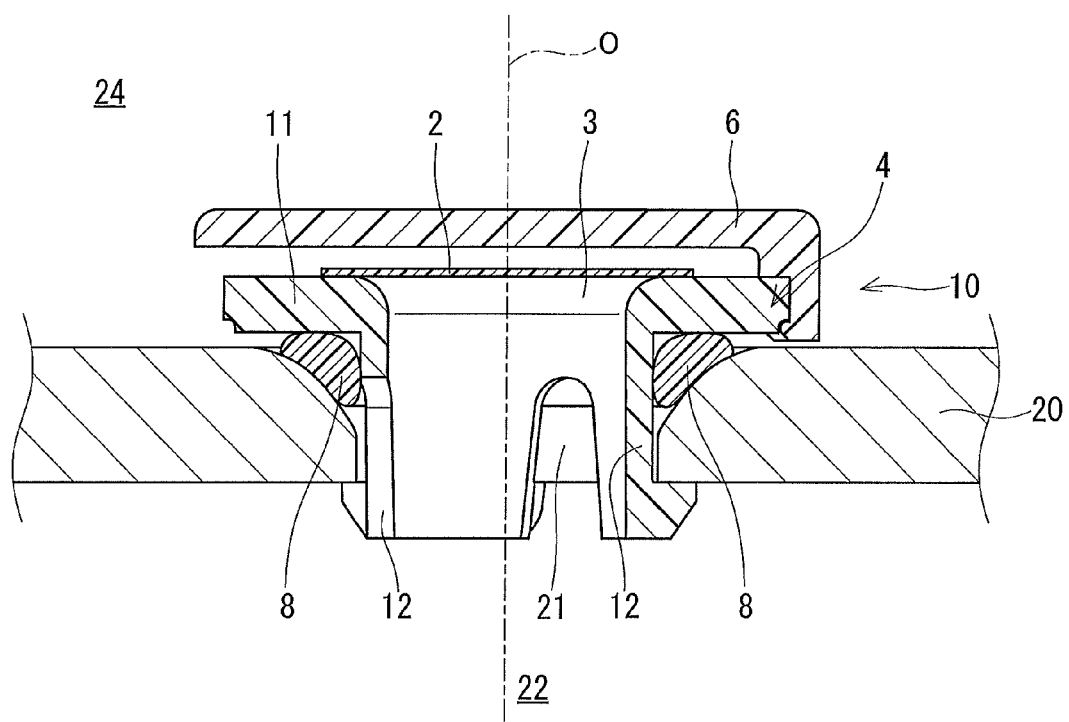
FIG. 2 is a cross-sectional view of the ventilation member shown in FIG. 1.

As shown in FIG. 1 and FIG. 2, a ventilation member 10 according to an embodiment of the present invention is adapted to be attached to an opening 21 of a housing 20. As shown in FIG. 2, the opening 21 is a through hole communicating an interior space 22 and an exterior space 24 of the housing 20. The ventilation member 10 includes an air-permeable membrane 2, a support 4, a cover member 6, and a sealing member 8. The air-permeable membrane 2, the support 4, and the cover member 6 each have a circular outline in plan view. The air-permeable membrane 2, the support 4, and the cover member 6 have a common central axis O. The thickness direction of the air-permeable membrane 2 is parallel to the central axis O. The support 4 has a vent hole 3 serving as a part of an air passage between the interior space 22 and the exterior space 24. The air-permeable membrane 2 is disposed on the support 4 so as to cover one end of the vent hole 3 that opens into the exterior space 24. Air can flow between the interior space 22 and the exterior space 24 through the air-permeable membrane 2. The housing 20 is, for example, an automotive ECU (electronic control unit) box, and FIG. 1 and FIG. 2 show only a part of the housing 20.

As shown in FIG. 2, the support 4 has a base portion 11 and a leg portion 12. The base portion 11 supports the air permeable membrane 2 and has an approximately disk shape. The leg portion 12 is adapted to fix the ventilation member 10 to the opening 21 of the housing 20. The leg portion 12 extends from the base portion 11 toward the interior space 22 of the housing 20.

As shown in FIG. 3 to FIG. 6, the leg portion 12 has: insertion portions 31 separated from each other in a circumferential direction by slits 32 formed between the insertion portions 31 in an insertion start side of the leg portion 12 and adapted to be elastically deformed radially inwardly when the insertion portions 31 are inserted into the opening 21 and then to be fixed to the opening 21; rounded portions 33 each formed in a region between an inner circumferential surface 31C of the insertion portion 31 (see FIG. 6) and a circumferential end surface 31D of the insertion portion 31 (see FIG. 6) at a root 31A of the insertion portion 31 and having a rounded convex surface (see FIG. 4 to FIG. 6); and hooks 34 each protruding radially outwardly from an insertion start side end 31B of the insertion portion 31 and adapted to be engaged with the housing 20. More specifically, the leg portion 12 is divided into three insertion portions 31, and the insertion portions 31 are provided at regular intervals (at regular angular intervals). The slit 32 is formed between each pair of adjacent insertion portions 31. That is, the three slits 32 are provided at regular intervals (at regular angular intervals).

Figure 3:
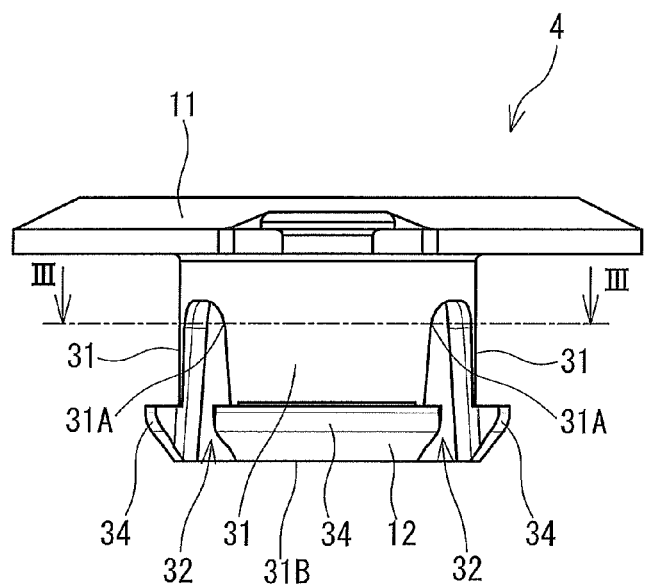
FIG. 3 is a side view of a support shown in FIG. 1.

As shown in FIG. 3, the insertion portions 31 are each a plate-shaped member extending from the base portion 11 toward the interior space 22 of the housing 20 (downward in FIG. 3), and are elastically deformable radially inwardly. The insertion portion 31 has, at its insertion start side end 31B, a hook 34 protruding radially outwardly, and the hook 34 is formed integrally with the insertion portion 31. The width of the insertion portion 31 gradually decreases from its root 31A toward the insertion start side end 31B (downward in FIG. 3). On the other hand, the width of the slit 32 formed between the insertion portions 31 gradually increases upward in FIG. 3.

Figure 6:
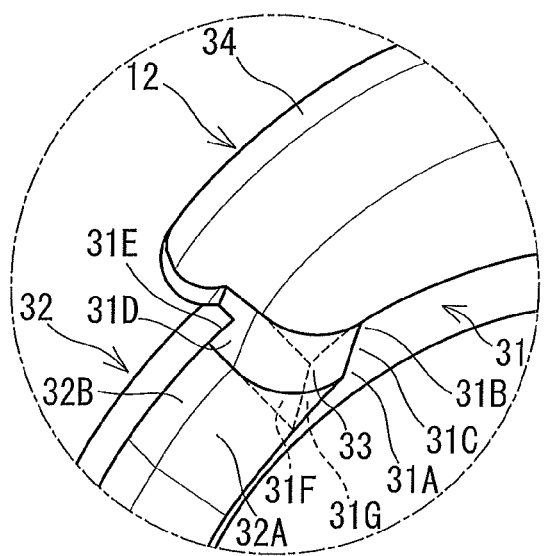
FIG. 6 is an enlarged view of a part IV of the leg portion shown in FIG. 4.
Figure 7:
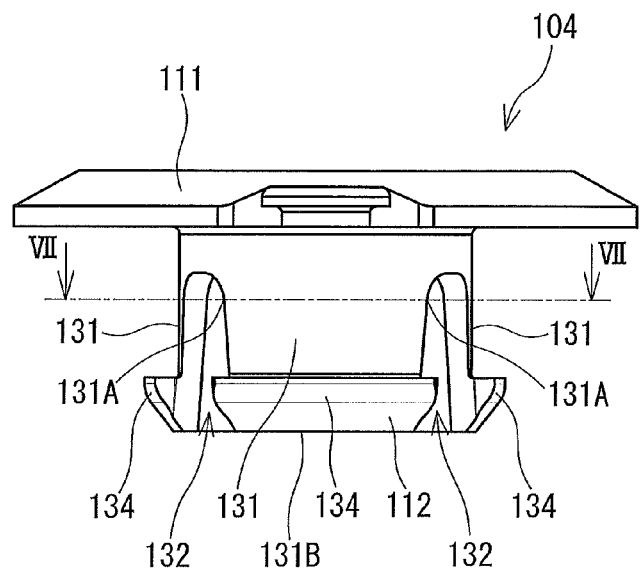
FIG. 7 is a side view of a conventional support.

As shown in FIG. 6, the rounded portion 33 having a rounded convex surface is formed in a region between the inner circumferential surface 31C and the circumferential end surface 31D of the insertion portion 31 at the root 31A of the insertion portion 31. Alternatively, the rounded portion 33 having a rounded convex surface extends from the root 31A to the insertion start side end 31B of the insertion portion 31 in the region between the inner circumferential surface 31C and the circumferential end surface 31D of the insertion portion 31. Specifically, when an imaginary surface extending radially inwardly from the edge of the circumferential end surface 31D is defined as an imaginary circumferential end surface 31F and an imaginary surface extending in the circumferential direction from the edge of the inner circumferential surface 31C at the root 31A of the insertion portion 31 toward the slit 32 is defined as an imaginary inner circumferential surface 31G, the rounded portion 33 recedes from the imaginary circumferential end surface 31F in a direction away from the slit 32 and recedes from the imaginary inner circumferential surface 31G toward the outer circumferential surface. Alternatively, in the region extending from the root 31A of the insertion portion 31 to the insertion start side end 31B thereof between the inner circumferential surface 31C and the circumferential end surface 31D of the insertion portion 31, the rounded portion 33 recedes from the imaginary circumferential end surface 31F in the direction away from the slit 32 and recedes from the imaginary inner circumferential surface 31G toward the outer circumferential surface.

The leg portion has a rounded convex surface in an inner circumferential region 32A at the bottom of the slit 32. The leg portion also has a rounded convex surface in an outer circumferential region 32B at the bottom of the slit 32. The curvature of the rounded surface of the inner circumferential region 32A at the bottom of the slit 32 is smaller than that of the rounded surface of the outer circumferential region 32B at the bottom of the slit 32. The area of the rounded surface of the inner circumferential region 32A at the bottom of the slit 32 is larger than that of the rounded surface of the outer circumferential region 32B at the bottom of the slit 32.

The rounded portion 33 having a rounded convex surface may be formed in a region between an outer circumferential surface 31E and the circumferential end surface 31D at the root 31A of the insertion portion 31. Alternatively, the rounded portion 33 having a rounded convex surface may extend from the root 31A of the insertion portion 31 to the insertion start side end 31B thereof in the region between the outer circumferential surface 31E and the circumferential end surface 31D of the insertion portion 31. The curvature of the rounded surface of the rounded portion 33 may be smaller than that of the rounded surface formed in the region between the outer circumferential surface 31E and the circumferential end surface 31D of the insertion portion 31. The area of the rounded surface of the rounded portion 33 may be larger than that of the outer circumferential region 32B at the bottom of the slit 32.

The sealing member 8 is an elastic member for sealing the gap between the support 4 and the housing 20 when the ventilation member 10 is attached to the housing 20. The sealing member 8 is an annular member adapted to be mounted around the opening 21 and between the support 4 and the housing 20. The sealing member 8 is made of an elastomer such as nitrile rubber, ethylene-propylene rubber, silicone rubber, fluorine rubber, acrylic rubber, or hydrogenated nitrile rubber. The sealing member 8 may be made of a foam material instead of an elastomer.

When the leg portion 12 of the support 4 is inserted into the opening 21 of the housing 20, the support 4 is pushed back in the direction in which it is removed from the housing 20 by the elastic force of the sealing member 8 interposed between the support 4 and the housing 20. When the support 4 is pushed back, the hooks 34 are engaged with the housing 20 in the interior space 22 of the housing 20 so as to prevent detachment of the ventilation member 10 from the housing 20. The portion corresponding to the sealing member 8 may be formed integrally with the support 4 by a technique such as two-color molding or insert molding. The sealing member 8 may be bonded to the support 4.

Next, FIG. 7 to FIG. 10 show a conventional ventilation member 110 for comparison. The conventional ventilation member 110 is the same as the ventilation member 10 of the embodiment described above except for the shape of the insertion portions 31. Therefore, the same parts are denoted by reference numerals obtained by adding 100 to the reference numerals given to the corresponding parts of the ventilation member 10, and the description thereof is omitted.

Figure 8:
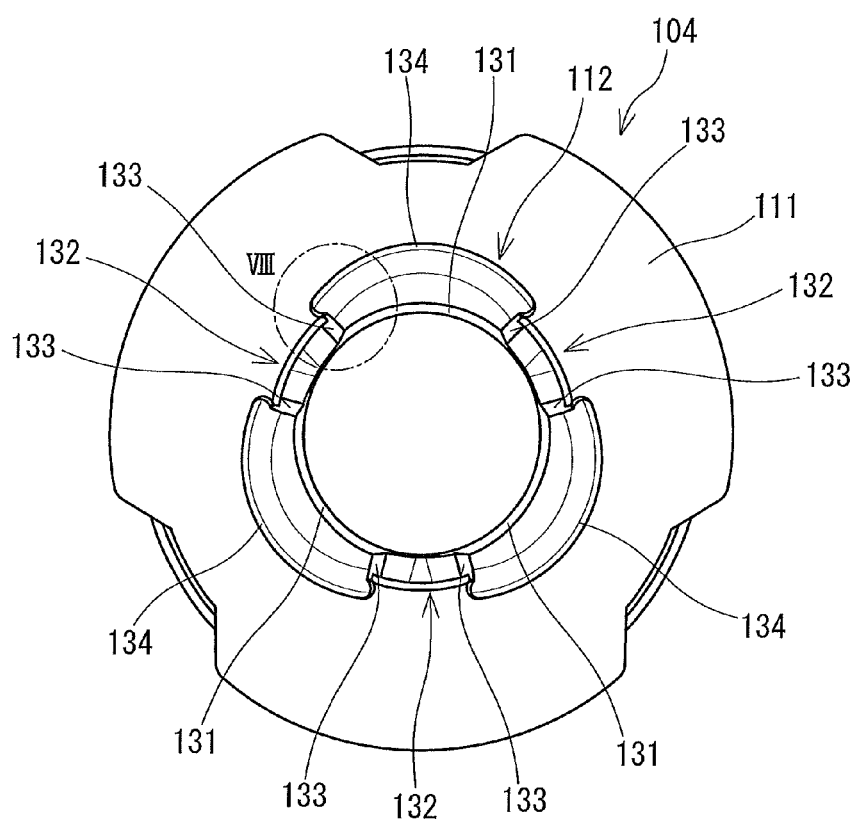
FIG. 8 is a bottom view of the support shown in FIG. 7.
Figure 9:
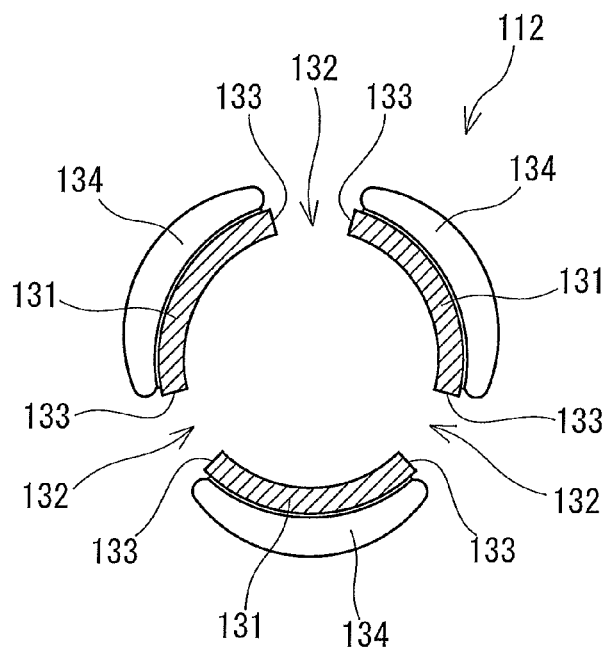
FIG. 9 is a cross-sectional view of the leg portion shown in FIG. 7, taken along the line VII-VII.
Figure 10:
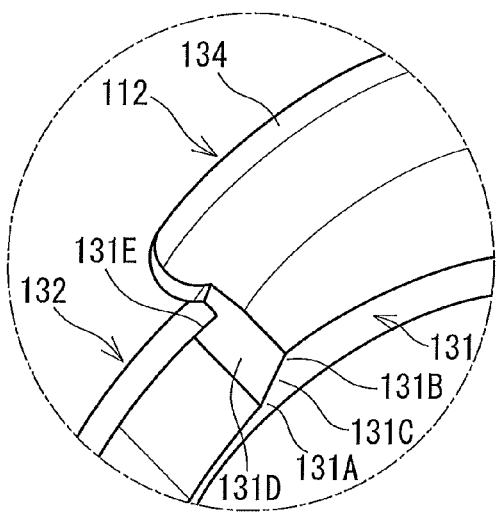
FIG. 10 is an enlarged view of a part VIII of the leg portion shown in FIG. 8.

As shown in FIG. 8 to FIG. 10, in the conventional ventilation member 110, a circumferential end surface 131D is formed in the entire region between the edge of an inner circumferential surface 131C of the insertion portion 131 and the edge of an outer circumferential surface 131E of the insertion portion 131 at the root 131A thereof. When this insertion portion 131 is inserted into the opening 121 while being elastically deformed radially inwardly and fixed to the opening 121, the inner circumferential surface 131C at the root 131A of the insertion portion 131 may crack due to stress concentration on the inner circumferential surface 131C at the root 131A of the insertion portion 131.

In contrast, in the present embodiment, the rounded portion 33 having a rounded convex surface is formed in the region between the inner circumferential surface 31C and the circumferential end surface 31D of the insertion portion 31 at the root 31A thereof. Therefore, stress is less likely to concentrate on the inner circumferential surface 31C at the root 31A of the insertion portion 31, and thus formation of cracks on the inner circumferential surface 31C at the root 31A of the insertion portion 31 can be prevented.

Figure 11:
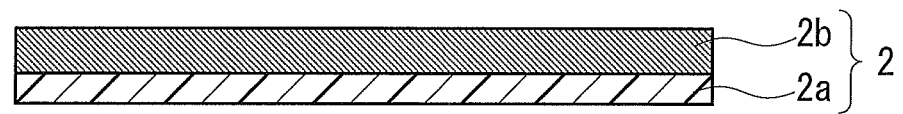
FIG. 11 is a cross-sectional view of an air-permeable membrane shown in FIG. 1.
Figure 12:
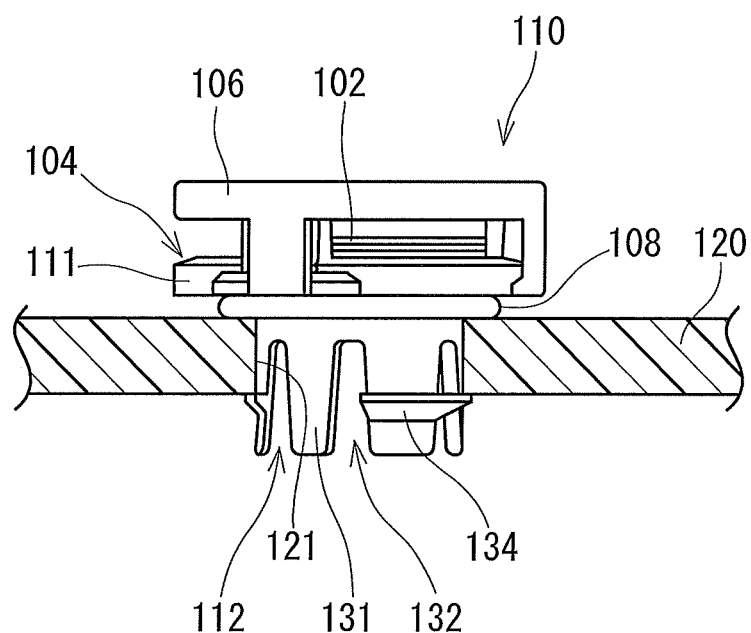
FIG. 12 is a cross-sectional view of the conventional support.

Next, the air-permeable membrane 2 is described. The structure and material of the air-permeable membrane 2 are not particularly limited and any membrane can be used as long as it has the properties of allowing gases to pass therethrough and preventing liquids from passing therethrough. As shown in FIG. 11, the air-permeable membrane 2 may have a membrane body 2a and a reinforcing material 2b laminated on the membrane body 2a. The strength of the air-permeable membrane 2 is increased by the reinforcing material 2b added thereto. It should be understood that the air-permeable membrane 2 may consist of the membrane body 2a.

The membrane body 2a may be subjected to an oil-repellent treatment or a water-repellent treatment. This liquid-repellent treatment can be performed by applying a substance having a low surface tension to the membrane body 2a, followed by drying and then curing. Any liquid-repellent agent can be used for the liquid-repellent treatment as long as a coating film having a lower surface tension than that of the membrane body 2a can be formed using the agent. For example, a liquid-repellent agent containing a polymer having a perfluoroalkyl group can be suitably used. The liquid-repellent agent is applied to the membrane body 2a by a known technique such as impregnation or spraying.

A typical example of the membrane body 2a is a porous membrane made of a fluorine resin or a polyolefin. In terms of ensuring sufficient waterproofness, a porous resin membrane having an average pore diameter of 0.01 to 10 μm can be used as the membrane body 2a.

Examples of the fluorine resin suitable for use as the membrane body 2a include polytetrafluoroethylene (PTFE), polychlorotrifluoroethylene, tetrafluoroethylene-hexafluoropropylene copolymer, and tetrafluoroethylene-ethylene copolymer. Examples of the polyolefin suitable for use as the membrane body 2a include polymers and copolymers of monomers such as ethylene, propylene, and 4-methylpentene-1,1 butene. Porous nanofiber film materials containing polyacrylonitrile, nylon, or polylactic acid may also be used. In particular, PTFE is preferred because it has not only high air permeability per unit area but also high ability to prevent foreign substances from entering the housing. Porous PTFE membranes can be produced by known molding techniques such as stretching and extraction.

The reinforcing material 2b can be a member made of a resin such as polyester, polyethylene, or aramid. The form of the reinforcing material 2b is not particularly limited as long as the air permeability of the air-permeable membrane 2 can be maintained. For example, the reinforcing member 2b is a woven fabric, a nonwoven fabric, a net, a mesh, a sponge, a foam, or a porous material. The membrane body 2a and the reinforcing member 2b may be laminated together by heat lamination, heat welding, or ultrasonic welding, or with an adhesive.

The thickness of the air-permeable membrane 2 is preferably in the range of 1 μm to 5 mm, in view of the strength and the ease of handling. The air permeability of the air-permeable membrane 2 is preferably in the range of 0.1 to 300 sec/100 $cm^3$ in terms of Gurley Number obtained by the Gurley test method specified in JIS (Japanese Industrial Standards) P 8117. The water entry pressure of the air-permeable membrane 2 is preferably 1.0 kPa or more.

The cover member 6 is attached to the support 4 to cover the air-permeable membrane 2. A space is formed between the air-permeable membrane 2 and the cover member 6. A space is also formed between the outer periphery of the cover member 6 and the outer periphery of the support 4. These spaces also serve as a part of an air passage between the interior space 22 and the exterior space 24.

Next, a method for producing the ventilation member 10 is described. First, the support 4 and the cover member 6 are produced separately. The support 4 and the cover member 6 each can be produced by a known injection molding technique. The material that can be used for the support 4 and the cover member 6 is typically a thermoplastic resin. Examples of the thermoplastic resin include polybutylene terephthalate, nylon, and polyethylene terephthalate.

The housing 20 also can be produced by a known injection molding technique. As shown in FIG. 1 and FIG. 2, one end of the opening 21 that opens into the exterior space 24 has a larger diameter than the other end of the opening 21 that opens into the interior space 22. Therefore, it is easy to insert the leg portion 12 into the opening 21. In addition, this shape of the opening 21 can increase, to some extent, the cross-sectional area of the air passage from the vent hole 3 to the interior space 22. Furthermore, since the diameter of the opening 21 is smaller on the interior space 22 side, the leg portion 12 is set so as to be inclined with respect to the central axis O. This is preferable in securely engaging the hooks 34 with the opening 21 to increase the attachment strength of the ventilation member 10 to the housing 20.

Hereinafter, the present invention will be described in more detail by way of examples, but the present invention is not limited to the following examples.

Example

Figure 4:
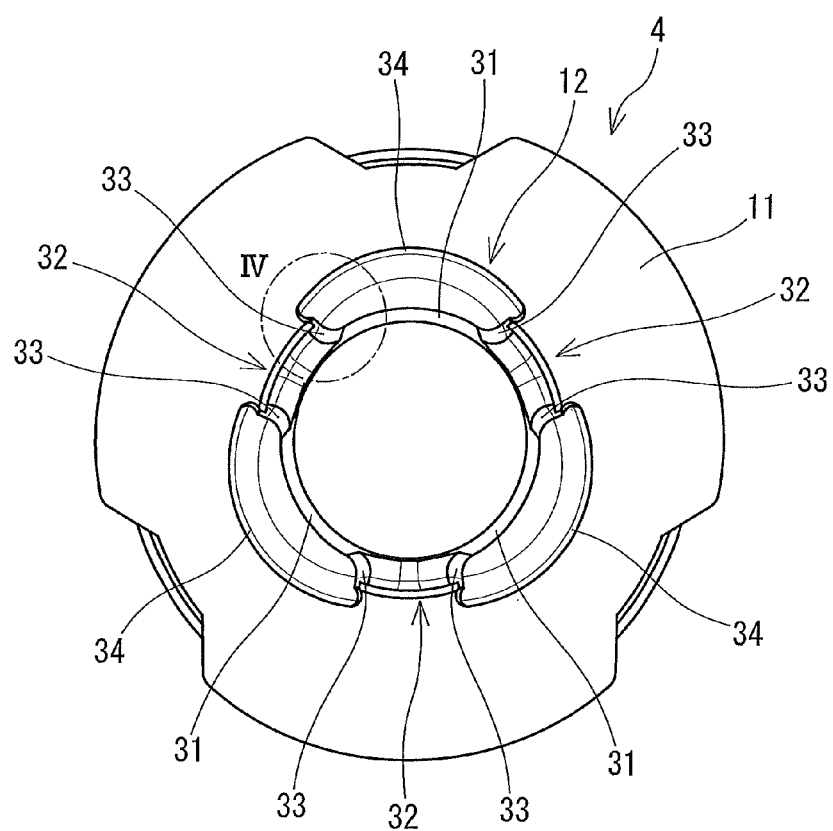
FIG. 4 is a bottom view of the support shown in FIG. 3.
Figure 5:
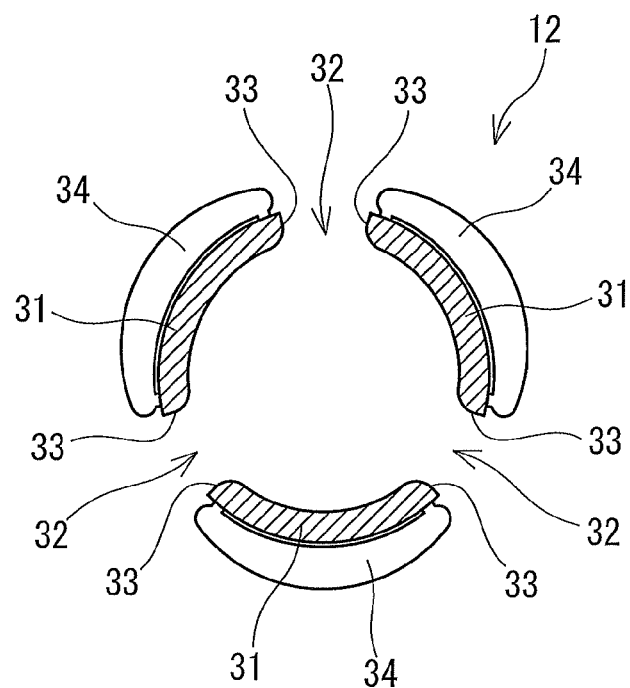
FIG. 5 is a cross-sectional view of a leg portion shown in FIG. 3, taken along the line III-III.

A ventilation member Z-PLUG (manufactured by Nitto Denko Corporation) having a structure shown in FIG. 7 to FIG. 10 and FIG. 12 was prepared, and the insertion portions of the ventilation member were cut to form the rounded portions shown in FIG. 4 to FIG. 6. A ventilation member thus obtained was attached to the opening (with a diameter of 8.2 mm) of a housing as shown in FIG. 1. In this ventilation member, no crack was observed on the inner circumferential surface at the root of the insertion portion.

Comparative Example 1

A Z-PLUG as a ventilation member was attached to the opening (with a diameter of 8.2 mm) of a housing as shown in FIG. 1. In this ventilation member, two cracks were observed on the inner circumferential surface at the root of the insertion portion.

Comparative Example 2

A Z-PLUG as a ventilation member was attached to the opening (with a diameter of 8.5 mm) of a housing as shown in FIG. 1. In this ventilation member, one crack was observed on the inner circumferential surface at the root of the insertion portion.

Next, simulation was performed with a general-purpose nonlinear structural analysis solver "Marc" (MSC Software Corporation) to calculate the maximum stress applied to the inner circumferential surface at the root of the insertion portion when the ventilation member was attached to the opening of the housing. When the maximum stress in Example was defined as 1.00, the maximum stress in Comparative Example 1 was 1.18 and the maximum stress in Comparative Example 2 was 1.05. That is, in the ventilation member of Example, the maximum stress on the inner circumferential surface of the insertion portion was lower than the maximum stress in the ventilation member of Comparative Example 1 or 2.

Simulation was performed with Marc to calculate the maximum radially inward displacement of the insertion portion when the ventilation member was attached to the opening of the housing after the ventilation member was subjected to a durability test (conditions for heat cycle test: −40° C. for 30 minutes to 125° C. for 30 minutes). When the maximum displacement in Comparative Example 1 was defined as 1.00, the maximum displacement in Example was 0.96. That is, the maximum radially inward displacement of the insertion portion in the ventilation member of Example was almost equal to the maximum radially inward displacement of the insertion portion in the ventilation member of Comparative Example 1. These results revealed that the ventilation member of Example was effective in reducing the risk of cracking on the inner circumferential surface at the root of the insertion portion while maintaining the maximum radially inward displacement of the insertion portion.

The ventilation member of the present invention can be used for housings for automotive components such as lamps, motors, sensors, switches, ECUs, and gear boxes. The ventilation member of the present invention can be used not only for automotive components but also for electric appliances such as mobile communication devices, cameras, electric shavers, and electric toothbrushes.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A ventilation member attachable to a housing having an interior space that requires ventilation and an opening for ventilation, the ventilation member comprising:
    a support having a vent hole serving as a part of an air passage between the interior space and an exterior space of the housing; and
    an air-permeable membrane disposed on the support to cover one end of the vent hole that opens into the exterior space,
    wherein
    the support comprises:
        a base portion supporting the air-permeable membrane; and
        a leg portion extending from the base portion toward the interior space and adapted to fix the ventilation member to the opening of the housing, and
    the leg portion comprises:
        insertion portions separated from each other in a circumferential direction by slits formed between the insertion portions in an insertion start side of the leg portion, the insertion portions being adapted to be elastically deformed radially inwardly when the insertion portions are inserted into the opening and then to be fixed to the opening; and
        rounded portions each formed in a region between an inner circumferential surface of the insertion portion and a circumferential end surface of the insertion portion at a root of the insertion portion and having a rounded convex surface.

2. The ventilation member according to claim 1, further comprising an annular sealing member adapted to be mounted around the opening and between the support and the housing.

3. The ventilation member according to claim 1, wherein the leg portion further comprises a hook protruding radially outwardly from an insertion start side end of the insertion portion and adapted to be engaged with the housing.

4. The ventilation member according to claim 1, wherein the leg portion has a rounded convex surface in an inner circumferential region at a bottom of the slit.

* * * * *